(12) United States Patent
Frederiksen

(10) Patent No.: US 10,714,176 B2
(45) Date of Patent: Jul. 14, 2020

(54) READ-WRITE CYCLE EXECUTION BASED ON HISTORY

(71) Applicant: Micron Technology, Inc., Boise, ID (US)

(72) Inventor: Jeffrey Frederiksen, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/103,277

(22) Filed: Aug. 14, 2018

(65) Prior Publication Data

US 2020/0058353 A1 Feb. 20, 2020

(51) Int. Cl.
*G06F 12/10* (2016.01)
*G11C 13/00* (2006.01)
*G06F 12/02* (2006.01)
*G11C 7/10* (2006.01)
*G06F 12/0831* (2016.01)

(52) U.S. Cl.
CPC ...... *G11C 13/0069* (2013.01); *G06F 12/0246* (2013.01); *G06F 12/0831* (2013.01); *G11C 7/1006* (2013.01); *G11C 2013/0076* (2013.01); *G11C 2213/71* (2013.01)

(58) Field of Classification Search
CPC .................. G11C 13/0069; G06F 12/0246
USPC .......................................................... 711/103
See application file for complete search history.

(56) References Cited

U.S. PATENT DOCUMENTS

| 5,590,298 | A | * | 12/1996 | Kawamoto | ......... | G06F 11/1435 |
| | | | | | | 711/113 |
| 2003/0191916 | A1 | * | 10/2003 | McBrearty | .......... | G06F 11/1464 |
| | | | | | | 711/162 |
| 2011/0066819 | A1 | * | 3/2011 | Mashtizadeh | ......... | G06F 3/0617 |
| | | | | | | 711/162 |

* cited by examiner

*Primary Examiner* — Jae U Yu
(74) *Attorney, Agent, or Firm* — Schwegman Lundberg & Woessner, P.A.

(57) ABSTRACT

Aspects of the present disclosure configure a media controller of a memory component to skip execution of a read-write cycle for specific data if the media controller has not observed at least one prior data modification request from a memory sub-system controller that causes modification of the specific data. For example, a media controller of a first memory component can be configured to include a data modification tracker to monitor a memory channel for data modification requests to a second memory component and to track data modification requests that have been observed by the media controller on the memory channel, where the memory channel may be one shared by the first and second memory components.

20 Claims, 4 Drawing Sheets

US 10,714,176 B2

READ-WRITE CYCLE EXECUTION BASED ON HISTORY

TECHNICAL FIELD

Embodiments of the disclosure relate generally to memory sub-systems, and more specifically, relate to read-write cycle execution in a memory sub-system based on history.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
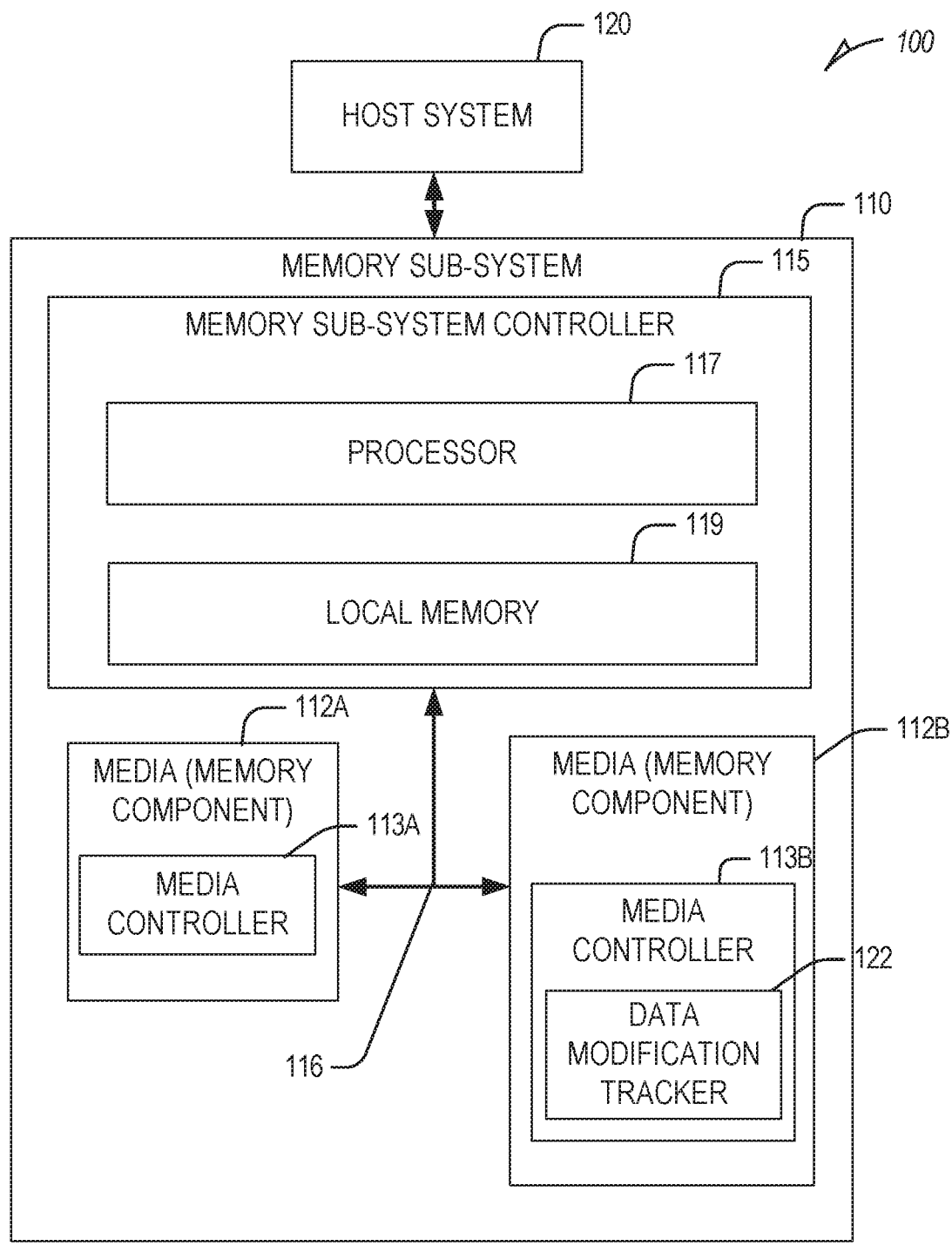
FIG. 1 is a block diagram illustrating an example computing environment including a memory sub-system, in accordance with some embodiments of the present disclosure.

Aspects of the present disclosure are directed to reducing latency and power consumption during a write cycle or a read-write cycle in a memory sub-system by determining whether to execute a write/read-write cycle based on history. A memory sub-system is also hereinafter referred to as a "memory device". An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data (e.g., via write requests) to be stored at the memory sub-system and can request data to be retrieved (e.g., via read requests) from the memory sub-system.

A memory sub-system can include multiple memory components that can store data from the host system. The memory sub-system can further include a memory sub-system controller that can communicate with each of the memory components to perform operations such as reading data, writing data, or erasing data at the memory components in response to requests received from the host system. Any one or more of the memory components of the memory sub-system may include a media controller to manage memory cells of the memory component, communicate with the memory sub-system controller, and execute memory requests (e.g., read or write) received from the memory sub-system controller.

In some applications, the memory sub-system can include a primary memory component (e.g., a cache or buffer) that provides temporary storage for data that is likely to be repeatedly used, and a secondary memory component (e.g., main memory) that provides more temporary storage for data than the primary memory component but having different operational characteristics than the primary memory component (e.g., read or write operations are slower than those of the primary memory component). The secondary memory component can comprise a persistent storage memory component. Generally, the primary memory component operates faster than the secondary memory component, while the secondary memory component is capable of storing more data than the primary storage memory component. Accordingly, when data is accessed (e.g., read) from the memory sub-system, the data can be copied from the secondary memory component to the primary memory component for access purposes. The secondary memory component can retain copies of data stored on the primary memory component. If data stored in the primary memory component is modified, the modified data is usually written back to the secondary memory component at some point (e.g., before the modified data is evicted from the primary memory component).

In certain implementations such as virtual machines, the memory sub-system controller may not be aware of whether the data from the primary memory component has been modified since the last time the data was written to the secondary memory component, requiring the memory sub-system controller to unconditionally request data be written back to the secondary memory component. Conventionally, in response to receiving a write request from the memory sub-system controller, the media controller of the secondary memory component executes a read-write cycle at the secondary memory component, which results in an increased average latency and power consumption by the memory sub-system because the read-write cycle unconditionally executes regardless of whether the underlying data has been changed. The latency and power consumption issue is exacerbated by certain memory sub-systems that require large blocks of data (e.g., 4 KB-1 MB) to be handled in a single request, which can be wasteful considering that efficient block accessibility of such memory sub-systems can be on the order of 16B.

Aspects of the present disclosure address the above and other deficiencies by configuring a media controller of a memory component to skip execution of a write cycle (or an entire read-write cycle) for specific data (e.g., a specific page of data) if the media controller has not observed at least one prior data modification request from the memory sub-system controller that causes modification of the specific data. For example, a media controller of a first memory component (e.g., that is serving as a secondary memory component of the memory sub-system) can be configured to include a data modification tracker to monitor (e.g., passively scan data traffic on) a memory channel for data modification requests to a second memory component (e.g., that is serving as a primary memory component of the memory sub-system) and to track data modification requests that have been observed by the media controller on the memory channel. For some embodiments, the memory channel is one shared by the first and second memory components.

For instance, where a first memory component is configured as a secondary memory component, a second memory component is configured as a primary memory component, and the first and second memory components are on a shared memory channel, when a specific data block or a data page is (initially or subsequently) written to the first memory component, the specific data block/data page is marked as not modified (unmodified) by the media controller of the first memory component. Subsequently, while monitoring the memory channel, if the media controller of the first memory component observes a data modification request to the second memory component for the (same) specific data block/data page, the media controller marks the specific data block/data page as modified. If the media controller of the first memory component receives a write or read-write cycle request for the specific data block/data page (to write the specific data block/data page back from the second memory component to the first memory component), the media controller of the first memory component can execute the write/read-write cycle request if the specific data block/data page is marked as modified, and skip or ignore the write/read-write cycle request otherwise. Additionally, where the media controller of the first memory component causes the first memory component to skip or ignore the requested write/read-write cycle request, the media controller of the first memory component can still issue a response indicating that the requested write/read-write cycle was completed. For some embodiments, sending this response (despite foregoing the write/read-write cycle) allows for the first memory component to be compatible with other memory components and memory sub-system controllers that expect such a response as acknowledgement of a successful memory operation and not raise a memory operation error.

In this way, according to various embodiments, the media controller of the first memory component can determine and keep track of whether there has been any change to specific data (e.g., a specific page of data) stored on the second memory component. If the media controller determines that the specific data has not changed based on the data modification tracker, the media controller skips a write cycle (or a read-write cycle) requested by a memory sub-system controller for the specific data. If, on the other hand, the media controller determines that at least one data bit of the specific data has changed based on the data modification tracker, the media controller executes the write/read-write cycle in response to the write/read-write cycle request by the memory sub-system controller. The write/read-write cycle can cause only the changed data bits to be written to the first memory component. As a result, the first memory component can determine whether to execute a write/read-write cycle based on a history of data modification requests observed by the media controller of the first memory component.

Accordingly, in various embodiments, execution of the write/read-write cycle can be avoided entirely by the first memory component in instances in which no data has been modified, which in turn can improve performance and efficiency of the memory sub-system. For example, in a memory component that has a fast low-powered read cycle (e.g., 100 ns) and a much slower high-powered write cycle (e.g., 400 ns), avoiding an unnecessary write/read-write cycle (e.g., when no data has been modified) can save 500 ns in processing time while also drastically reducing power consumption because the write cycle of the memory component (which may be high-powered) is avoided.

Though various embodiments are described herein with respect to executing or skipping a write cycle (e.g., requested by a memory sub-system controller), it will be understood that for some embodiments, this involves executing or skipping a read-write cycle (e.g., requested by a memory sub-system controller), where the write cycle is part of the read-write cycle.

Disclosed herein are some examples of memory sub-systems which are configured to reduce latency and power consumption during a non-deterministic read-write cycle.

FIG. 1 illustrates an example computing environment 100 including a memory sub-system 110, in accordance with some examples of the present disclosure. The memory sub-system 110 can include media, such as memory components 112A and 112B. The memory components 112A and 112B can be volatile memory devices, non-volatile memory devices, or a combination of such. As shown, the memory components 112A and 112B share a memory channel 116 that permits command and data communication between a memory sub-system controller 115 and each of the memory components 112A and 112B. In some embodiments, the memory sub-system 110 is a storage system. An example of a storage system is an SSD. In some embodiments, the memory sub-system 110 is a hybrid memory/storage system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or a direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, a universal serial bus (USB) interface, a Fibre Channel interface, a Serial Attached SCSI (SAS) interface, etc. The physical host interface can be used to transmit data between the host system 120 and the memory sub-system 110. The host system 120 can further utilize an NVM Express (NVMe) interface to access the memory components 112A and 112B when the memory sub-system 110 is coupled with the host system 120 by the PCIe interface. The physical host interface can provide an interface for passing control, address, data, and other signals between the memory sub-system 110 and the host system 120.

The memory components 112A and 112B can include any combination of the different types of non-volatile memory components and/or volatile memory components. An example of non-volatile memory components includes a negative- and (NAND)-type flash memory. Each of the memory components 112A and 112B can include one or more arrays of memory cells such as single-level cells (SLCs) or multi-level cells (MLCs) (e.g., triple-level cells (TLCs) or quad-level cells (QLCs)). In some embodiments, a particular memory component can include both an SLC portion and an MLC portion of memory cells. Each of the memory cells can store one or more bits of data (e.g., data blocks) used by the host system 120. Although non-volatile memory components such as NAND-type flash memory are described, the memory components 112A and 112B can be based on any other type of memory, such as a volatile memory. In some embodiments, the memory components 112A and 112B can be, but are not limited to, random access memory (RAM), dynamic random access memory (DRAM), synchronous dynamic random access memory (SDRAM), phase change memory (PCM), magnetoresistive random access memory (MRAM), negative-or (NOR) flash memory, and a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write-in-place operation, where a non-volatile memory cell can be programmed without the non-volatile memory cell being previously erased. Furthermore, the memory cells of the memory components 112A and 112B can be grouped as memory pages or data blocks that can refer to a unit of the memory component used to store data.

The memory sub-system controller 115 can communicate with the memory components 112A and 112B to perform operations such as reading data, writing data, or erasing data at the memory components 112A and 112B and other such operations. The memory sub-system controller 115 can include hardware such as one or more integrated circuits and/or discrete components, a buffer memory, or a combination thereof. The memory sub-system controller 115 can be a microcontroller, special-purpose logic circuitry (e.g., a field programmable gate array (FPGA), an application specific integrated circuit (ASIC), etc.), or another suitable processor. The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing microcode. While the example memory sub-system 110 in FIG. 1 has been illustrated as including the memory sub-system controller 115, in another embodiment of the present disclosure, a memory sub-system 110 may not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory components 112A and 112B. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory components 112A and 112B. The memory sub-system controller 115 can further include host interface circuitry to communicate with the host system 120 via the physical host interface. The host interface circuitry can convert the commands received from the host system 120 into command instructions to access the memory components 112A and 112B as well as convert responses associated with the memory components 112A and 112B into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory components 112A and 112B.

Any one of the memory components 112A and 112B can include a media controller (e.g., media controller 113A and media controller 113B) to manage the memory cells of the memory component, to communicate with the memory sub-system controller 115, and to execute memory requests (e.g., read or write) received from the memory sub-system controller 115.

In some implementations of the memory sub-system 110, at least one of the memory components 112A and 112B can be configured as a primary memory component (e.g., a cache or buffer), and at least one of the memory components 112A and 112B can be configured as a secondary memory component (e.g., main memory). For example, a non-volatile memory component such as a cross-point array memory component can be used as a secondary memory component, and a volatile memory device such as a DRAM can be used as a primary memory component. In these implementations, data stored on the primary memory component is copied to the secondary memory component at various times. In some embodiments, the primary memory component can be a temporary storage component that temporarily stores data that is likely to be reused, and the secondary memory component can be a persistent storage component that stores persistent copies of the data stored in the temporary storage component. Additionally, in some embodiments, the primary memory component serves as a temporary storage component that temporarily stores data that is likely to be reused, while a secondary memory component (e.g., main memory) serves as a temporary storage component that provides more temporary storage for data than the primary memory component while having different operational characteristics than the primary memory component (e.g., read or write operations are slower than those of the primary memory component).

Consistent with these embodiments, each of the memory components 112A and 112B may communicate with the memory sub-system controller 115 via the memory channel 116. For example, both the primary and secondary memory components may communicate with the memory sub-system controller 115 via a dual in-line memory module (DIMM) interface, or both the primary and secondary memory components may communicate with the memory sub-system controller 115 via a non-volatile DIMM (NVDIMM) interface, or another such interface (e.g., one that allows for deterministic and non-deterministic read-write cycles).

Consistent with these implementations, the memory sub-system controller 115 may not be aware of whether the data from the primary memory component has been modified since the last time the data was written to the secondary memory component. For example, in virtual machine implementations, the memory sub-system controller 115 can include a hypervisor that creates and runs virtual machines using the memory components 112A and 112B. In this example, the hypervisor does not have a priori knowledge of whether data stored in the primary memory component has been modified since it was last copied over to the secondary memory component. Accordingly, in these implementations, the memory sub-system controller 115 unconditionally sends a request to the media controller of the secondary memory component to write back data from the primary memory component to the secondary memory component regardless of whether it has been modified. Conventionally, in response to receiving a write request from the memory sub-system controller 115, the media controller of the secondary memory component (e.g., the media controller 113B of the memory component 112B) executes a read-write cycle at the secondary memory component (e.g., the memory component 112B) whether or not the data needs to be written to the secondary memory component. This, in turn, results in an increased average latency for the memory sub-system 110, power consumption for the memory sub-system 110, or both. Additionally, the request from the media controller 115 (e.g., based on a request from a hypervisor operating on the host system 120) may be for a coarser resolution (e.g., coarser page size) than is optimal for the secondary memory component (e.g., the page size of the second memory component may be smaller than the page size of the request).

To address the foregoing latency and power consumption issue, a media controller of any one of the memory components 112A and 112B (e.g., the memory component configured as the secondary memory component) may be configured to skip execution of a write cycle (or a read-write cycle) requested by the memory sub-system controller 115 for specific data (e.g., a specific page of data) if the media controller has not observed at least one prior data modification request by the memory sub-system controller 115 that causes modification of the specific data. For example, as shown, the media controller 113B of the memory component 112B (e.g., that is serving as a secondary memory component of the memory sub-system 110) is configured to include a data modification tracker 122 to monitor (e.g., passively scan data traffic on) the memory channel 116, shared by the memory components 112A and 112B, for data modification requests from the memory sub-system controller 115 to the memory component 112A (e.g., that is serving as a primary memory component of the memory sub-system 110). Based on the monitoring, the data modification tracker 122 can detect data modification requests on the memory channel 116 and keep track of them (e.g., by storing/updating tracking data on a reserved portion of memory space on the memory component 112B or on a separate dedicated memory). The media controller 113B is further configured to determine whether to perform or forego the write cycle (or the read-write cycle) based on the data modification request tracking performed by the data modification tracker 122.

For instance, if the media controller 113B of the memory component 112B determines via the data modification tracker 122 that a data block or a data page stored on the memory component 112A (e.g., acting as the primary memory) has not changed since the last time the data block/data page was written to the memory component 112B (e.g., acting as the secondary memory), the media controller 113B skips execution of the write/read-write cycle that attempts to write back the data block/data page from the memory component 112A to the memory component 112B. Thus, there is a reduction in latency, reduction in power consumption, or both, that would have otherwise been caused by the memory component 112B needlessly executing the write/read-write cycle in an instance where no data actually needs to be written to the memory component 112B.

On the other hand, while monitoring the memory channel 116, if the media controller 113B detects that since the last time the data block/data page was written to the memory component 112B, at least one data modification request for the data block/data page was sent from the memory sub-system controller 115 to the memory component 112A, the media controller 113B executes the write/read-write cycle to write back the data block/data page from the memory component 112A to the memory component 112B.

As noted herein, the data modification tracker 122 determines that a data block or data page stored on the memory component 112A has changed by monitoring the memory channel 116 and detecting whether (since the last time the data block/data page was written to the memory component 112B) a data modification request has been sent from the memory sub-system controller 115 to the memory component 112A to modify the data block/data page stored on the memory component 112A. If the data modification tracker 122 determines that the data block/data page stored on the memory component 112A has changed by at least detecting the data modification request, the data modification tracker 122 can mark the data block/data page as modified. For some embodiments, the data modification tracker 122 marks the data block/data page as unmodified when the data block/data page is (e.g., initially or subsequently) written to the memory component 112B. The marking of data blocks/data pages as modified and unmodified by the data modification tracker 122 enables the media controller 113B of the memory component 112B to track the modification status of data blocks/data pages stored on the memory component 112B.

Figure 2:
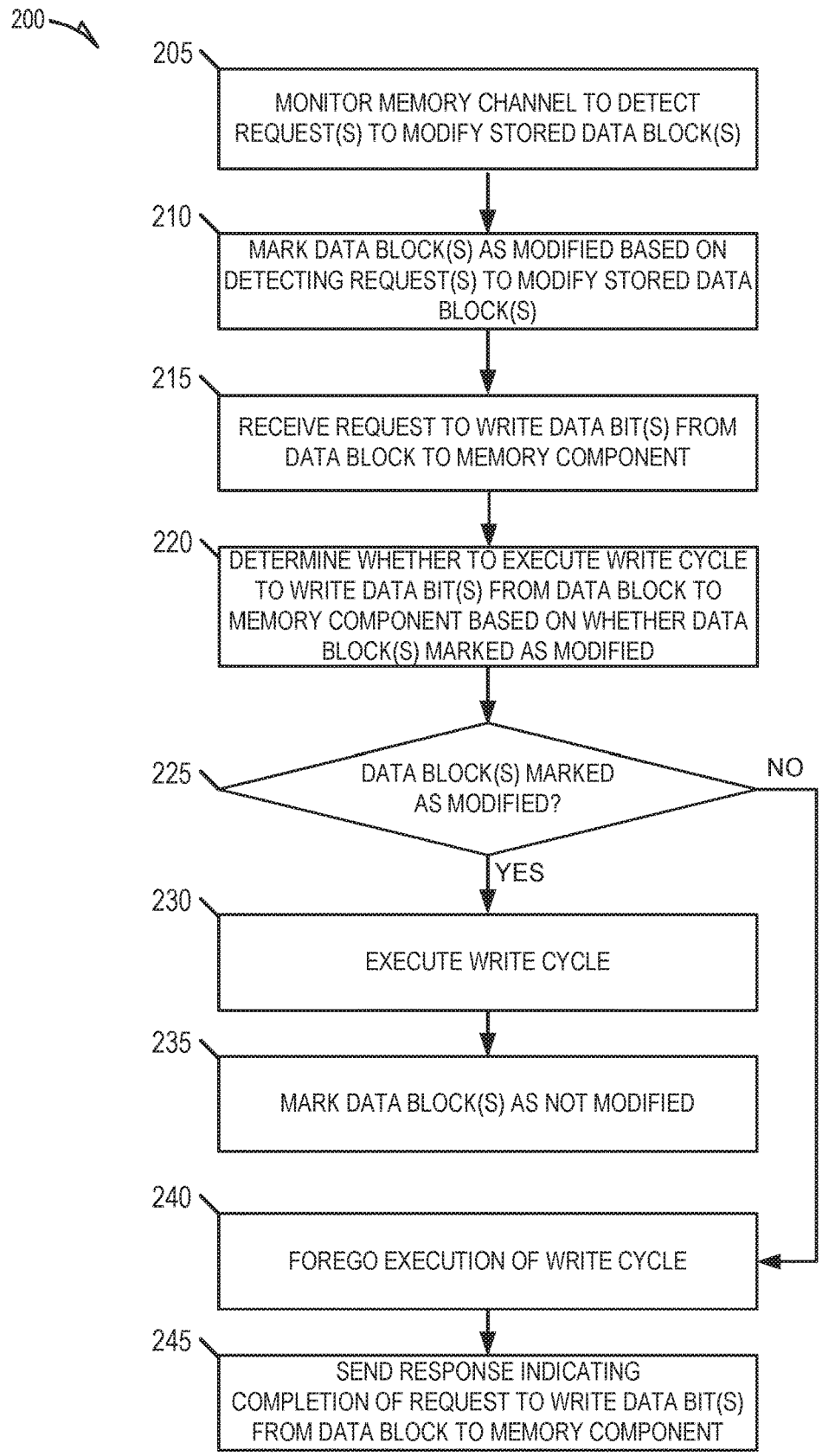
FIG. 2 is a flow diagram illustrating an example method to reduce latency and power consumption during a write cycle or read-write cycle, in accordance with some embodiments of the present disclosure.

FIG. 2 is a flow diagram of an example method 200 to reduce latency and power consumption during a write cycle or read-write cycle, in accordance with some implementations of the present disclosure. The method 200 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 200 is performed by the media controller 113B of FIG. 1. In these embodiments, the method 200 may be performed, at least in part, by the data modification tracker 122. Although the processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 205, a processing device of a first memory component monitors a memory channel to detect a first request to modify a first data block stored on a second memory component, where the memory channel is shared by the first memory component and the second memory component. The second memory component can comprise a volatile memory component (e.g., double data rate (DDR) SDRAM) configured as a primary memory component (e.g., cache memory), and the first memory component can comprise a non-volatile memory component (e.g., an array of cross-point memory cells) configured as a secondary memory component. Additionally, depending on the embodiment, the first memory component can have a non-deterministic write cycle or non-deterministic read-write cycle.

At block 210, the processing device of the first memory component marks the first data block as modified based on detecting the first request to modify the first data block stored on the second memory component. Marking the first data block as modified may comprise modifying a data bit, associated with the first data block, to indicate that the first data block stored on the second memory component has been modified, the data bit being stored on the first memory component. Additionally, the data bit associated with the first data block may be stored in a reserved memory space on the first memory component, where the reserved memory space stores a plurality of data bits that each indicate whether a different block of data has been modified on the second memory component. Alternatively, the data bit associated with the first data block may be stored in a local high-speed memory component, or in a cache, or a caching combination of the local high-speed memory component and the first memory component. For some embodiments, each data block/data page stored on the second memory component may be represented by a single data bit, where the single data bit may indicate whether a copy of the data block/data page stored on the second memory component is modified or not modified relative to the version of the data block/data page stored on the first memory component. As noted herein, any time a specific data block or a specific data page is written back from the second memory component (e.g., configured as primary memory) to the first memory component (e.g., configured as secondary memory), the specific data block/data page is marked as unmodified in accordance with various embodiments.

At block 215, the processing device of the first memory component receives a second request to write a first sequence of data bits from the first data block of the second memory component to the first memory component.

As will be discussed further below, the second request to write can be generated by a memory sub-system controller (e.g., the memory sub-system controller 115) in response to encountering a cache miss in sending a memory request (e.g., write or read) to the second memory component configured as primary memory. The second request can include one or more memory addresses corresponding to one or more memory cells in the first memory component in which a second data block that is a version of the first data block is stored.

At block 220, the processing device of the first memory component determines whether to execute a write cycle, at the first memory component, to write the first sequence of data bits from the first data block to the first memory component based on whether the first data block has been marked as modified. For some embodiments, executing the write cycle (to write the first sequence of data bits from the first data block stored on the second memory component to the first memory component) may comprise executing a read-write cycle to write the first sequence of data bits from the first data block stored on the second memory component to the first memory component. Accordingly, for such embodiments, foregoing the write cycle comprises foregoing the read-write cycle, and executing the write cycle comprises executing the read-write cycle.

At block 225, if the processing device of the first memory component determines that the first data block is marked as modified, the method 200 proceeds to block 230, and otherwise (i.e., if the processing device determines that the first data block is not marked as modified), the method 200 proceeds to block 240.

At block 230, the processing device of the first memory component executes (or causes execution of) the write cycle, at the first memory component, in response to determining that the first data block has been marked as modified. During the write cycle, the processing device can write only the changed bits to the corresponding memory cells in the first memory component, and the processing device may not write any unchanged bits. That is, the processing device can write to the first memory component only the data bits from the first sequence of data bits of the second memory component that correspond to the difference between the first sequence of data bits and the respective data bits stored on the first memory component.

At block 235, the processing device of the first memory component marks the first data block as not modified in response to executing the write cycle. Since the first data block has been written back from the second memory component to the first memory component at block 230, the copy of the first data block stored on the second memory component is no longer modified relative to the copy of the first data block stored on the first memory component.

At block 240, the processing device of the first memory component foregoes execution of the write cycle (or causes the execution of the write cycle to be foregone), at the first memory component, in response to determining that the first data block has not been marked as modified. As noted herein, since the processing device has determined that the copy of the first data block stored on the second memory component has not been modified since the last time the first data block was written to the first memory component, a write cycle is unnecessary and the processing device can forego execution of the write cycle at block 240.

At block 245, the processing device of the first memory component sends a response to the second request (to write the first sequence of data bits from the first data block of the second memory component to the first memory component) indicating completion of the second request. As noted herein, sending this response (despite foregoing the write/read-write cycle at block 240) allows for the first memory component to be compatible with other memory components (e.g., the second memory component) and memory sub-system controllers that expect such a response as acknowledgement of a successful memory operation and not raise a memory operation error.

Figure 3:
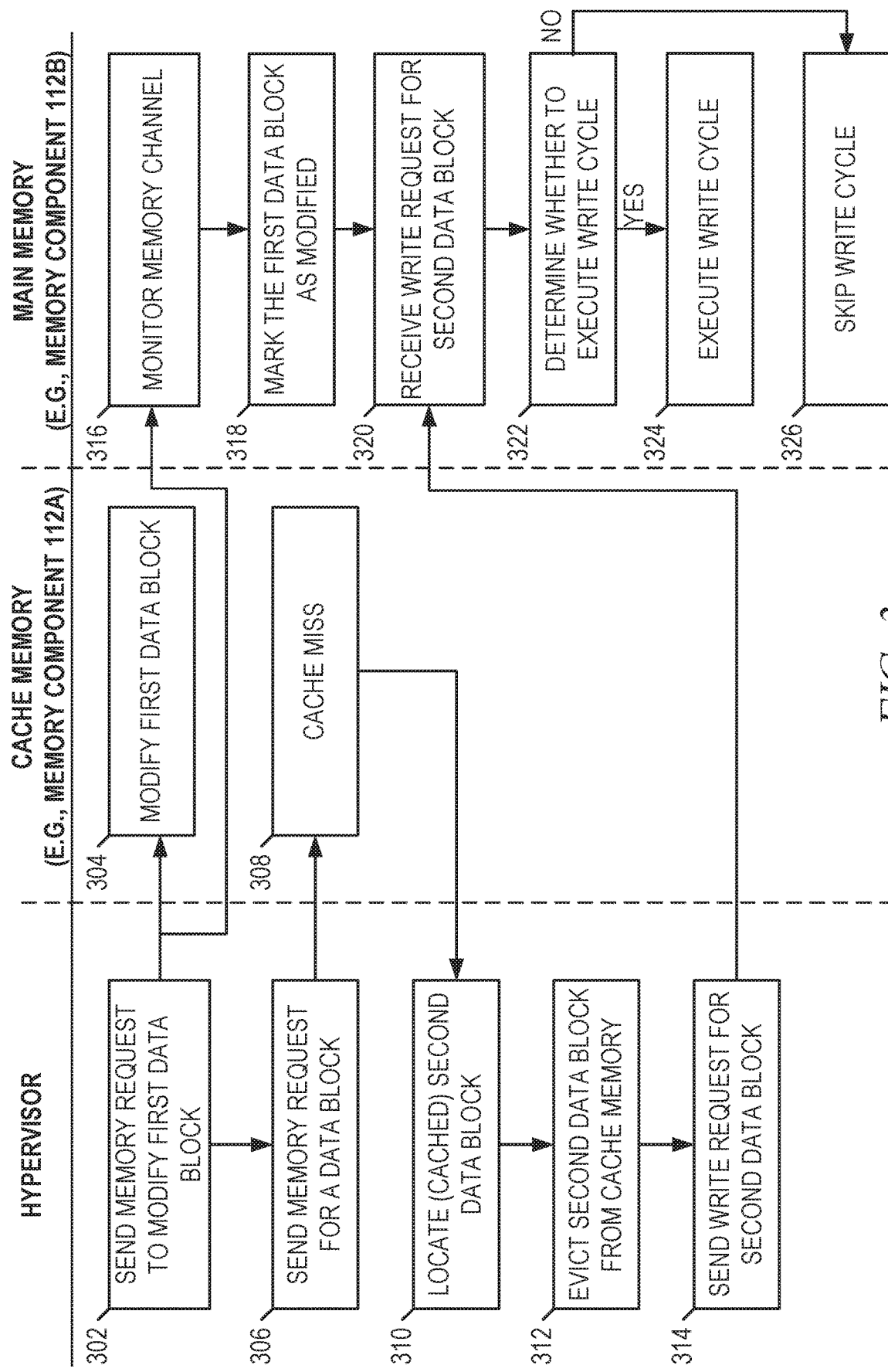
FIG. 3 is an interaction diagram illustrating interactions between components of the computing environment in the context of an example embodiment in which a method to reduce latency and power consumption during a write cycle or a read-write cycle can be implemented, in accordance with some embodiments of the present disclosure.

FIG. 3 is an interaction diagram illustrating interactions between components of the computing environment 100 in the context of an example embodiment in which a method to reduce latency and power consumption during a write cycle or read-write cycle can be implemented. The method 300 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 300 is performed by a combination of the memory sub-system controller 115 in the example form of a hypervisor, the memory component 112A configured as a cache memory component, and the memory component 112B configured as a main memory component. Although the processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment.

In the context of the example illustrated in FIG. 3, the cache memory component can be a volatile memory component (e.g., a DDR memory component), and the main memory component can be a non-volatile memory component with a non-deterministic read-write cycle (e.g., a cross-point array of memory cells).

As shown, at block 302, the hypervisor sends a memory request directed to the cache memory component to modify a first data block. For some embodiments, the request from the hypervisor is at a data block size (e.g., page size, such as 4 kB) that is less than optimal for the main memory component (e.g., optimal page size of 512B). At block 304, the cache memory component modifies the first data block as requested. Concurrently, at block 316, the main memory component monitors a memory channel shared by the cache memory component and the main memory component, and during the monitoring, the main memory component detects the memory request to modify the first data block sent by the hypervisor. Subsequently, at block 318, the main memory component marks the first data block as modified in response to detecting the memory request to modify the first data block sent by the hypervisor.

Continuing with block 306, the hypervisor sends a memory request directed to the cache memory component. The request can be either a request to read data (e.g., third data block) from the cache memory component or a request to write data (e.g., third data block) to the cache memory component. At block 308, a cache miss occurs at the cache memory component (e.g., because the cache memory component does not include an entry for the requested data).

In response to the cache miss, the hypervisor locates a (cached) second data block in the cache memory component, at block 310, and the hypervisor evicts the cached second data block from the cache memory component, at block 312, to create memory space on the cache memory component for the requested data. Since the hypervisor does not have a priori knowledge of whether the evicted second data block has been modified since the last write-back to the main memory component, the hypervisor performs an unconditional write-back to the main memory component each time a cached data block is evicted from the cache whether or not the cached data block has been modified since the last write-back to the main memory. Accordingly, at block 314, the hypervisor sends a write request to write the second data block to the memory media of the main memory component. As noted herein, the write request for the second data block by the hypervisor is unconditional, as the hypervisor lacks a priori knowledge of whether the evicted cache block has been modified since the last write-back to the main memory component. Additionally, as noted herein, the request from the hypervisor may be at a data block size (e.g., page size, such as 4 kB) that is less than optimal for the main memory component (e.g., optimal page size of 512B).

Upon receiving the write request, the memory sub-system controller 115 sends a write request to the main memory component to write back the second data block from the cache memory. At block 320, the main memory component receives the write request for the second data block.

At block 322, the main memory component determines whether to execute the write cycle based on whether the second data block is marked as modified (based on the monitoring at block 316). If at block 322 the main memory component determines that the second data block is modified, then at block 324, the main memory component executes the write cycle for the second data block. For some embodiments, the write cycle performed on the main memory component is for a data block size (e.g., page size, such as 512B) that is more optimal (e.g., smaller) than the data block size of the request made by the hypervisor (e.g., 4 kB).

On the other hand, if at block 322 the main memory component determines that the second data block is not modified, then at block 326, the main memory component skips the write cycle for the second data block.

For example, if the first data block and the second data block represent the same specific data block, the memory request to modify the specific data block at block 302 causes the main memory component, at block 318, to mark the specific data block as modified. Eventually, at block 322, the main memory component determines to execute the write cycle based on the specific data block being marked as modified (at block 318), and, at block 324, the main memory component executes the write cycle for the specific data block.

Alternatively, the first data block and the second data block may represent different data blocks, and at block 316, the main memory component never detects a memory request to modify the second data block. Eventually, at block 322, the main memory component determines to skip the write cycle for the second data block based on the second data block not being marked as modified (at block 318). At block 326, the main memory component skips the write cycle for the second data block.

Figure 4:
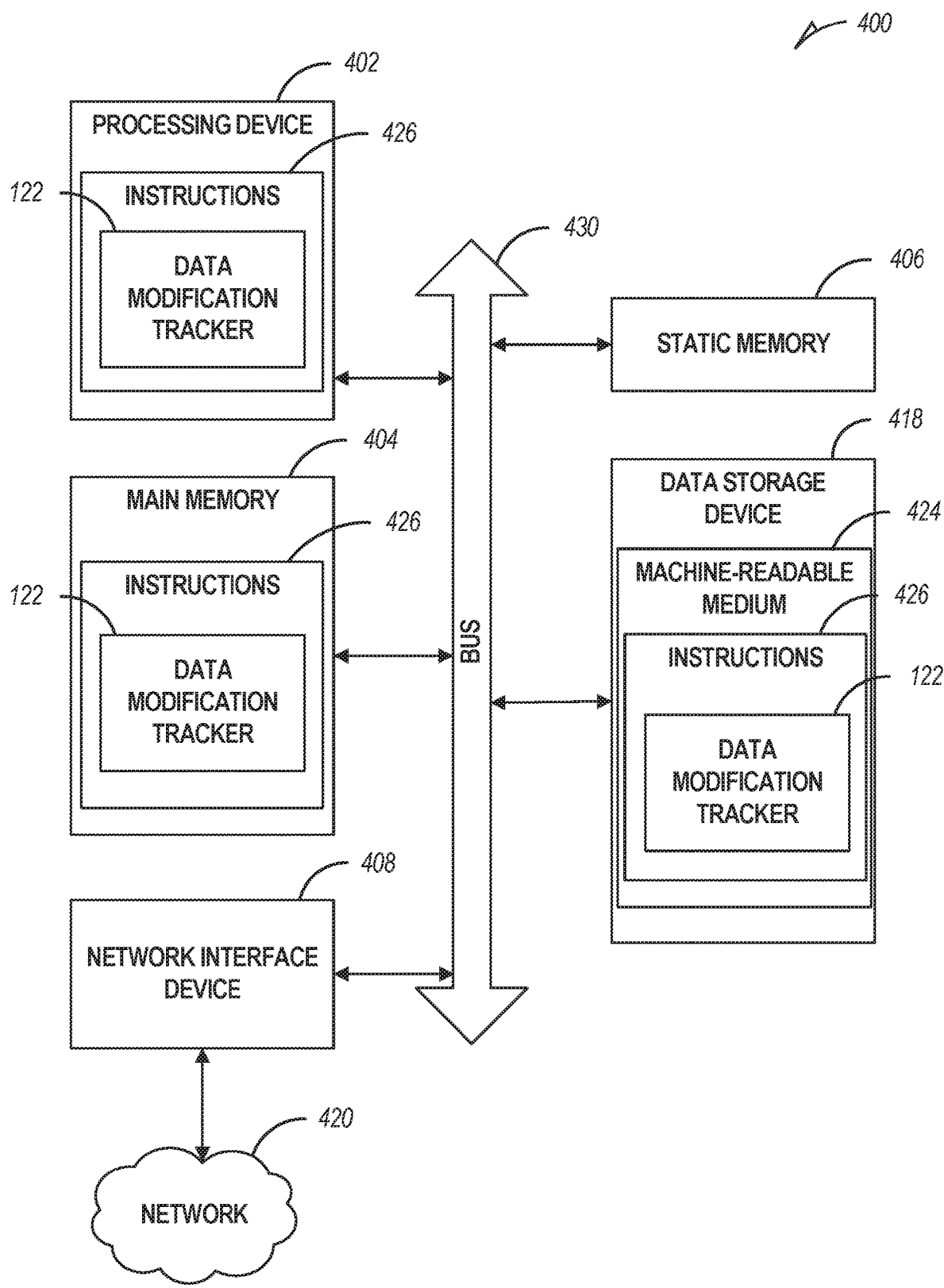
FIG. 4 is a block diagram illustrating a diagrammatic representation of a machine in the form of a computer system within which a set of instructions can be executed for causing the machine to perform any one or more of the methodologies discussed herein, in accordance with some embodiments of the present disclosure.

FIG. 4 illustrates an example machine in the form of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the data modification tracker 122 of FIG. 1). In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a network switch, a network bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage device 418, which communicate with each other via a bus 430.

The processing device 402 represents one or more general-purpose processing devices such as a microprocessor, a central processing unit, or the like. More particularly, the processing device 402 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 402 can also be one or more special-purpose processing devices such as an application specific integrated circuit (ASIC), a field programmable gate array (FPGA), a digital signal processor (DSP), a network processor, or the like. The processing device 402 is configured to execute instructions 426 for performing the operations and steps discussed herein. The computer system 400 can further include a network interface device 408 to communicate over a network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110 of FIG. 1.

In one embodiment, the instructions 426 include instructions to implement functionality corresponding to a data modification tracker (e.g., the data modification tracker 122 of FIG. 1). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system's memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks; read-only memories (ROMs); random access memories (RAMs); erasable programmable read-only memories (EPROMs); EEPROMs; magnetic or optical cards; or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description above. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine-readable (e.g., computer-readable) storage medium such as a read-only memory (ROM), random access memory (RAM), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

EXAMPLES

Example 1 is a system comprising: a first memory component; and a processing device, operatively coupled to the first memory component, configured to perform operations comprising: monitoring a memory channel to detect a first request to modify a first data block stored on a second memory component, the memory channel being shared by the first memory component and the second memory component; marking the first data block as modified based on detecting the first request to modify the first data block stored on the second memory component; receiving a second request to write a first sequence of data bits from the first data block of the second memory component to the first memory component; and determining whether to execute a write cycle, at the first memory component, to write the first sequence of data bits from the first data block to the first memory component based on whether the first data block has been marked as modified.

In Example 2, the subject matter of Example 1 optionally includes the operation of foregoing execution of the write cycle, at the first memory component, in response to determining that the first data block has not been marked as modified.

In Example 3, the subject matter of Example 1 or Example 2 optionally includes the operation of sending a response to the second request to write the first sequence of data bits from the first data block of the second memory component to the first memory component, the response indicating completion of the second request.

In Example 4, the subject matter of any one of the Examples 1 to 3 optionally includes the operation of executing the write cycle, at the first memory component, in response to determining that the first data block has been marked as modified.

In Example 5, the subject matter of any one of the Examples 1 to 4 optionally includes the operation of marking the first data block as not modified in response to executing the write cycle.

In Example 6, the write cycle of any one of the Examples 1 to 5 optionally includes a read-write cycle.

In Example 7, the marking the first data block as modified of any one of the Examples 1 to 6 optionally includes modifying a data bit, associated with the first data block, to indicate that the first data block stored on the second memory component has been modified, the data bit being stored on the first memory component.

In Example 8, the data bit associated with the first data block of any one of the Examples 1 to 7 is optionally stored in a reserved memory space on the first memory component, the reserved memory space storing a plurality of data bits that each indicate whether a different block of data has been modified on the second memory component.

In Example 9, the first request to modify the first data block stored on the second memory component of any one of the Examples 1 to 8 is optionally transmitted by a memory sub-system controller.

In Example 10, the processing device of any one of the Examples 1 to 9 is optionally part of a media controller associated with the first memory component.

In Example 11, for the subject matter of any one of the Examples 1 to 10, the first memory component is optionally configured as a secondary memory component, and the second memory component is optionally configured as a primary memory component.

In Example 12, the first memory component of any one of the Examples 1 to 11 optionally includes non-volatile memory media; and the second memory component of Example 1 optionally includes volatile memory media.

Example 13 is a method comprising: monitoring, by a media controller operatively coupled to a first memory component, a memory channel to detect a first request to modify a first data block stored on a second memory component, the memory channel being shared by the first memory component and the second memory component; marking, by the media controller, the first data block as modified based on detecting the first request to modify the first data block stored on the second memory component; receiving, at the media controller, a second request to write a first sequence of data bits from the first data block of the second memory component to the first memory component; and determining, by the media controller, whether to execute a write cycle, at the first memory component, to write the first sequence of data bits from the first data block to the first memory component based on whether the first data block has been marked as modified.

In Example 14, the subject matter of Example 13 optionally includes foregoing, by the media controller, execution of the write cycle, at the first memory component, in response to determining that the first data block has not been marked as modified.

In Example 15, the subject matter of any one of the Examples 13 to 14 optionally includes sending, by the media controller, a response to the second request to write the first sequence of data bits from the first data block of the second memory component to the first memory component, the response indicating completion of the second request.

In Example 16, the subject matter of any one of the Examples 13 to 15 optionally includes executing, by the media controller, the write cycle, at the first memory component, in response to determining that the first data block has been marked as modified.

In Example 17, the subject matter of any one of the Examples 13 to 16 optionally includes marking, by the media controller, the first data block as not modified in response to executing the write cycle.

In Example 18, the write cycle of any one of the Examples 13 to 17 optionally includes a read-write cycle.

In Example 19, the marking the first data block as modified of any one of the Examples 13 to 18 optionally includes modifying a data bit, associated with the first data block, to indicate that the first data block stored on the second memory component has been modified, the data bit being stored on the first memory component.

In Example 20, the data bit associated with the first data block of any one of the Examples 13 to 19 is optionally stored in a reserved memory space on the first memory component, the reserved memory space storing a plurality of data bits that each indicate whether a different block of data has been modified on the second memory component.

In Example 21, the first request to modify the first data block stored on the second memory component of any one of the Examples 13 to 20 is optionally transmitted by a memory sub-system controller.

In Example 22, for the subject matter of any one of the Examples 13 to 21, the first memory component is optionally configured as a secondary memory component, and the second memory component is optionally configured as a primary memory component.

Example 23 is a memory sub-system comprising: a first memory component; and a media controller, operatively coupled to the first memory component, the media controller configured to perform operations comprising: monitoring a memory channel to detect a request to modify a first data block stored on a second memory component, the memory channel being shared by the first memory component and the second memory component; marking the first data block as modified based on detecting the request to modify the first data block stored on the second memory component; receiving a request to write a first sequence of data bits from the first data block of the second memory component to the first memory component; and determining whether to execute a write cycle, at the first memory component, to write the first sequence of data bits from the first data block to the first memory component based on whether the first data block has been marked as modified.

The invention claimed is:

1. A system comprising:
a first memory component; and
a media controller of the first memory component, the media controller configured to perform operations comprising:
monitoring a memory channel to detect a first request to a second memory component to modify a first data block stored on the second memory component, the memory channel being shared by the first memory component and the second memory component;
marking the first data block as modified based on detecting the first request;
receiving a second request to write a first sequence of data bits from the first data block of the second memory component to the first memory component; and
in response to the second request:
based on whether the first data block has been marked as modified, determining whether to complete the second request by executing a write cycle at the first memory component to write the first sequence of data bits from the first data block of the second memory component to the first memory component; and
in response to determining that the first data block has not been marked as modified:
foregoing execution of the write cycle at the first memory component; and
sending a response to the second request, the response indicating completion of writing the first sequence of data bits from the first data block of the second memory component to the first memory component despite the foregoing the execution of the write cycle.

2. The system of claim 1, wherein the operations further comprise:
in response to determining that the first data block has been marked as modified, executing the write cycle at the first memory component.

3. The system of claim 2, wherein the operations further comprise:
marking the first data block as not modified in response to executing the write cycle.

4. The system of claim 1, wherein the marking the first data block as modified comprises:
modifying a data bit, associated with the first data block, to indicate that the first data block stored on the second memory component has been modified, the data bit being stored on the first memory component.

5. The system of claim 4, wherein the data bit associated with the first data block is stored in a reserved memory space on the first memory component, the reserved memory space storing a plurality of data bits that each indicate whether a different data block has been modified on the second memory component.

6. The system of claim 1, wherein the write cycle comprises a read-write cycle.

7. The system of claim 1, wherein:
the first memory component is configured as a secondary memory component; and
the second memory component is configured as a primary memory component.

8. The system of claim 1, wherein the first request and the second request are sent from a memory sub-system controller coupled to the memory channel, and the response is sent to the memory sub-system controller.

9. The system of claim 1, wherein the second memory component operates as a cache for the first memory component.

10. A method comprising:
monitoring, by a media controller of a first memory component, a memory channel to detect a first request to a second memory component to modify a first data block stored on the second memory component, the memory channel being shared by the first memory component and the second memory component;
marking, by the media controller, the first data block as modified based on detecting the first request;
receiving, at the media controller, a second request to write a first sequence of data bits from the first data block of the second memory component to the first memory component; and
in response to the second request:
based on whether the first data block has been marked as modified, determining, by the media controller, whether to complete the second request by executing a write cycle at the first memory component to write the first sequence of data bits from the first data block of the second memory component to the first memory component; and
in response to determining that the first data block has not been marked as modified:
foregoing, by the media controller, execution of the write cycle at the first memory component; and
sending, by the media controller, a response to the second request, the response indicating completion of writing the first sequence of data bits from the first data block of the second memory component to the first memory component despite the foregoing the execution of the write cycle.

11. The method of claim 10, further comprising:
in response to determining that the first data block has been marked as modified, executing, by the media controller, the write cycle at the first memory component.

12. The method of claim 11, further comprising:
marking, by the media controller, the first data block as not modified in response to executing the write cycle.

13. The method of claim 10, wherein the marking the first data block as modified comprises:
modifying a data bit, associated with the first data block, to indicate that the first data block stored on the second memory component has been modified, the data bit being stored on the first memory component.

14. The method of claim 13, wherein the data bit associated with the first data block is stored in a reserved memory space on the first memory component, the reserved memory space storing a plurality of data bits that each indicate whether a different data block has been modified on the second memory component.

15. The method of claim 10, wherein the write cycle comprises a read-write cycle.

16. The method of claim 10, wherein:
the first memory component is configured as a secondary memory component; and
the second memory component is configured as a primary memory component.

17. The method of claim 10, wherein the second memory component operates as a cache for the first memory component.

18. A memory sub-system comprising:
a first memory component comprising non-volatile memory;
a second memory component comprising volatile memory;
a memory channel shared by the first memory component and the second memory component; and
a media controller of the first memory component, the media controller configured to perform operations comprising:
monitoring the memory channel to detect a first request to the second memory component to modify a first data block stored on the second memory component;
marking the first data block as modified based on detecting the first request to modify the first data block stored on the second memory component;
receiving a second request to write a first sequence of data bits from the first data block of the second memory component to the first memory component;
determining whether to execute a write cycle, at the first memory component, to write the first sequence of data bits from the first data block to the first memory component based on whether the first data block has been marked as modified, and
in response to determining that the first data block has not been marked as modified:
foregoing execution of the write cycle at the first memory component; and
sending a response to the second request, the response indicating completion of writing the first sequence of data bits from the first data block of the second memory component to the first memory component despite the foregoing the execution of the write cycle.

19. The memory sub-system of claim 18, wherein the second memory component operates as a cache for the first memory component.

20. The memory sub-system of claim 18, further comprising:
a memory sub-system controller coupled to the memory channel, the first request and the second request being sent from the memory sub-system controller.

* * * * *